Figure 1:
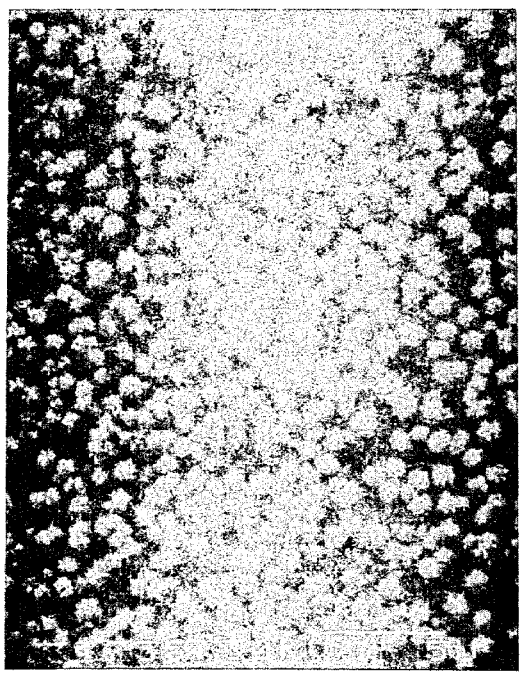

United States Patent [19]

Aliotta et al.

[11] 4,335,189

[45] Jun. 15, 1982

[54] RESOLUTION STANDARD FOR SCANNING ELECTRON MICROSCOPE COMPRISING PALLADIUM SPINES ON A METAL SUBSTRATE

[75] Inventors: Carmelo F. Aliotta, Beacon; Morris Anschel, Carmel, both of N.Y.

[73] Assignee: International Business Machines Corp., Armonk, N.Y.

[21] Appl. No.: 172,577

[22] Filed: Jul. 28, 1980

[51] Int. Cl.³ .................... H01F 1/00; G01N 31/00
[52] U.S. Cl. ................... 428/611; 428/663; 428/670; 428/687; 250/304; 250/311
[58] Field of Search ............... 428/611, 620, 663, 669, 428/670, 687; 250/304, 306, 307, 311; 313/311, 330

[56] References Cited

U.S. PATENT DOCUMENTS

| | | | |
|---|---|---|---|
| 3,982,148 | 9/1976 | Kaplan et al. | 313/330 |
| 4,005,698 | 2/1977 | Cuomo et al. | 126/270 |
| 4,145,632 | 3/1979 | Devine, Jr. | 313/330 |
| 4,148,294 | 4/1979 | Scherber et al. | 126/270 |
| 4,235,226 | 11/1980 | Scherber et al. | 126/449 |

OTHER PUBLICATIONS

Kaiser, H. D., Pakulski, F. J. and Schmeckenbecker, A. F., "A Fabrication Technique for Multilayer Ceramic Modules," *Solid State Technology*, May 1972, pp. 35-40.
Backovic, N., Jancic, M., Radonjic, L. J., "Study of Electroless Ni-P Depositions on Aluminum," presented at 2nd Balkan Congress on Electron Microscopy, Istanbul, Turkey, Sep. 25-30, 1977, paper E-91.
Hedgecock, N., Tung, P., Schlesinger, M., "On the Structure and Electrical Properties of Electroless Ni-B Films", *Journal of Electrochemical Society*, vol. 122, No. 7, (Jul. 1975), pp. 866-869.
NBS SRM-484, Magnification Standard Reference Material, NBS RM-100 Resolution Test Specimens published by Office of Standard Reference Materials, National Bureau of Standards, Washington D.C.

Primary Examiner—L. Dewayne Rutledge
Assistant Examiner—Christopher W. Brody
Attorney, Agent, or Firm—W. S. Robertson

[57] ABSTRACT

A resolution standard for a scanning electron microscope has clusters of palladium in a sea urchin form. The clusters are widely scattered on a substrate so that a cluster can be acquired easily for a resolution test. The tips of the spines on the clusters are on the order of 50 Angstroms and they present a sharp clear image to an electron microscope that is operating properly. A process for forming the clusters is also disclosed.

5 Claims, 3 Drawing Figures

RESOLUTION STANDARD FOR SCANNING ELECTRON MICROSCOPE COMPRISING PALLADIUM SPINES ON A METAL SUBSTRATE

BACKGROUND

In a scanning electron microscope, a subject is irradiated with a high voltage beam of electrons that sweeps across the subject in a raster that is analagous to the raster that an electron beam forms on the face of a cathode ray tube of a television set. In response to the primary electrons from the beam, the subject emits a relatively large number of secondary electrons that travel outwardly in a hemispherical pattern. An electron detector detects these electrons and ultimately produces a corresponding video signal of the point of high voltage impact. The video signal varies with the specimen-beam interaction. A variation in secondary electrons is due to topography, composition, crystallinity, and magnetic or electronic effects.

A cathode ray tube monitor has its electron beam sweep synchronized with the electron beam sweep of the scanning electron microscope and the video signal from the detector modulates the beam of the CRT monitor. Thus, the monitor displays an image of the subject.

Electron microscopes are capable of magnification on the order of 100,000 times. However, the electron microscope is a complex instrument and its performance can be degraded from various causes. Thus, it is a practice to begin an operation with a scanning electron microscope by viewing a standard test subject that has a recognizable appearance when the scanning electron microscope is operating properly. Such a test subject is called a resolution standard.

Using a resolution standard is somewhat analagous to testing the quality of a low power magnifying glass by viewing the fine details of the engraving on a dollar bill. With a good lens of appropriate magnification, fine details of the engraving can be clearly seen. If the dollar bill is out of focus or if the lens is of poor quality or if the surface of the lens needs cleaning, the image is correspondingly unclear and small details cannot be resolved. To consider this analogy further, the dollar bill functions well as a resolution standard because it has distinguishable features of a known approximate size. (A resolution standard is not used to calibrate an exact unit of measurement but it can be combined with a calibration standard). As an additional parallel, the resolution standard has a suitable pattern over a particular area so that it will ordinarily be possible to find a readily usable area for the test even though particular areas may become unusable. If the image of the resolution standard is unsatisfactory, this can be confidently attributed to the imaging system or to other instrument problems such as vacuum leaks, vibrations and the like. Alternatively, a defective resolution standard can be readily identified and replaced.

Dendritic aluminum tungstem has been proposed as a resolution standard for a scanning electron microscope. ("The 30th Annual Proceedings of Electron Microscope Society", Los Angeles, Calif., C. J. Arceneaux, Editor.) To a scanning electron microscope, the dendritic aluminum tungsten growth presents details on the order of 100 Angstroms. A variety of other devices have been proposed that similarly provide observable details in the range of resolution that is required for many subjects for which scanning electron microscope is used.

SUMMARY OF THE INVENTION

One of the objects of this invention is to provide a new and improved resolution standard and a process for fabricating such a standard. The preferred resolution standard is made up of many widely spaced hemispherical shaped (approximately 1 micron diameter) palladium structures containing very fine pointed palladium spines (appropriately called "sea urchins"). The tips of these projections can be formed with viewable details on the order of 50 Angstroms, as seen in a low loss image made of an experimental SEM.

Another object of the invention is to provide a process by which a resolution standard can be formed easily and inexpensively and with close repeatability of the process. Preferably, palladium clusters are formed by depositing palladium from a suitable solution (such as palladium chloride) on a suitable substrate such as molybdenum. Various shapes form under different conditions and the preferred sea urchin form can be achieved readily.

Other objects and features of the invention will be apparent from the following description of a preferred embodiment of the invention.

THE DRAWINGS

Figure 2:
Figure 3:
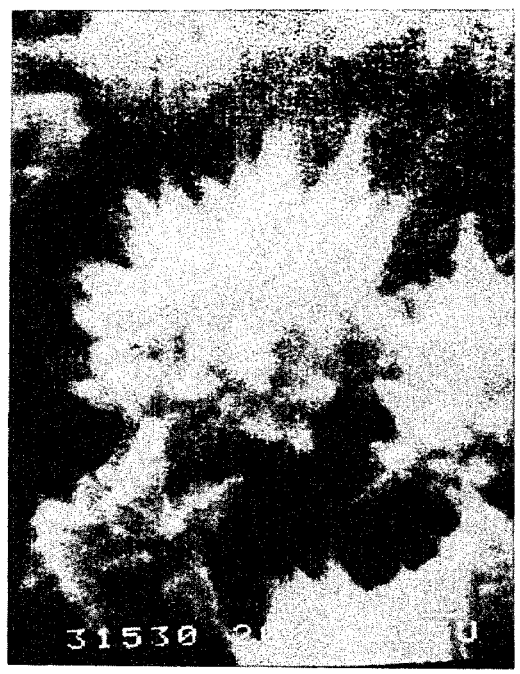

FIGS. 1, 2 and 3 are scanning electron microscope views of the preferred resolution standard at magnifications of 5000, 50,000 and 100,000 times respectively.

THE PREFERRED RESOLUTION SAMPLE

FIG. 1—Without magnification, the resolution standard appears simply as a gray piece of metal. At the magnification of FIG. 1 (5000×) the individual clusters can be seen as bright, widely separated elements. The bright bar in the lower right hand corner of FIG. 1 is 5 microns in length (50,000 Angstroms). The gray background in the drawing is the molybdenum substrate. It is a useful property of the standard of this invention that the clusters are widely separated because this feature allows the operator of a scanning electron microscope to easily acquire an individual cluster for a resolution test. FIG. 1 shows that there are many clusters in a sample. If some clusters become contaminated or damaged many other clusters will ordinarily remain usable.

FIG. 2—At the higher magnification of FIG. 2, numerous pointed spines can be seen clearly. The spines can be measured at their tips. The reference bar is 0.5 microns (5000 Angstroms) in length. In the drawing, one millimeter represents about 200 Angstroms.

FIG.3—Further shows the tips to be about 100 Angstroms in diameter. The "sea urchin" configuration is readily apparent in this view. If there is any malfunction or vibration to the scanning electron microscope, there will be a fuzzy or striated image of the pointed spines or projections.

The sample is rectangular in shape, about ⅛ inch by ¼ inch, as is conventional for a resolution sample. It is mounted (e.g., by adhesive) on a conventional "Cambridge stud" or on an aluminum rivet of the same general size.

THE PREFERRED PROCESS

Preparing the substrate—Select a metal substrate whose atoms will be replaced by palladium atoms in a solution of a palladium halide. Various metals may be useful as the substrate material. From tests with other metals (aluminum, molybdenum, copper) we have found that the metal and the condition of the metal surface affect the growth of the crystals. Of the metals tested, only molybdenum has given the preferred sea urchin configuration.

Our first experiments involved the use of silicon wafers containing thermally grown oxide layers of 6000 Angstroms. Molybdenum was RF sputtered at a substrate temperature of 350 degrees centigrade, with a deposition rate of 290 Angstroms per minute yielding an average film thickness of 15,000 Angstroms. However, we later found that it is completely satisfactory to use thin molybdenum "shim stock." The shim stock is thick enough to handle without unnecessary precautions and it is thin enough that a piece of shim stock initially a few inches on a side in size can be easily cut to the sample size (about ⅛ inch by ¼ inch) at the completion of the processing.

The molybdenum shim stock initially has an oxide, as well as general contaminates on its surface and the presence of these contaiminates affects the crystal configurations that are achieved. The preferred sea urchin configuration was best achieved after the substrate had been chemically polished to remove the oxide. In the preferred process the following aqueous cleaning bath was used.

Potassium Ferricyanide, $K_3Fe(CN)_6$, 0.4 M,
Disodium Phosphate, $Na_2HPO_4$, 0.16 M,
Potassium Hydroxide, KOH, to adjust pH to $9\pm0.5$ Sodium and potassium salts are interchangeable for each of the three components. Monosodium phosphate, $NaH_2PO_4$, or trisodium phosphate, $Na_3PO_4$, may be substituted for disodium phosphate, within the limits of the pH. We contemplate that other cleaning solutions will be found satisfactory.

The molybdenum shim stock is placed in the cleaning solution (using a non-metal holder for the shim stock) for about 30 seconds. It is then removed from the cleaning solution and rinsed in deionized water for about 30 seconds.

Forming the clusters—The clusters form when the cleansed substrate is emersed in a 0.1% aqueous solution of a palladium halide (preferably palladium chloride, $PdCl_2$) with or without a surfactant containing one ml of concentrated HCl per 1000 ml of dionized water. The temperature of the solution is about 50 degrees Celsius. The solution is stirred to maintain a uniform concentration of palladium chloride at the surface of the substrate. (If the stirring is inadequate, the tips of the spines are blunt rather than sharp.) The substrate is kept in the palladium chloride solution for about 30 seconds—the substrate takes on a grayish appearance when the clusters have formed.

The process can be carried out quickly with simple laboratory apparatus, and the sea urchin form with sharp spines can be grown easily. Generally, if the temperature is increased or if the concentration is increased, the crystal growth is faster and the palladium structures take on a tree-like shape instead of forming sea urchins. When the tree forms are viewed with an electron microscope, small details can be seen, but the trees do not provide the high resolution test of the sea urchin form. Conversely, when the temperature of the solution is reduced or conditions otherwise restrict crystal growth, the crystal formation is generally featureless and clusters do not appear.

From the preceding description of a preferred embodiment of the invention and a preferred process, those skilled in the art will recognize a variety of modifications within the spirit of the invention and the scope of the claims.

Having thus described our invention, what we claim as new, and desire to secure by Letters Patent is:

1. A resolution standard for a scanning electron microscope, comprising,
    a metal substrate,
    clusters of palladium formed on the substrate, the clusters being generally spaced apart for ease of acquisition by the operator of a scanning electron microscope and having spines with dimensions on the order of 50 Angstroms at their tips.

2. The resolution standard of claim 1 wherein the clusters have a sea urchin appearance.

3. The resolution standard of claim 2 wherein the clusters are formed on the substrate from an aqueous solution of palladium chloride.

4. The resolution standard of claim 3 wherein the substrate is molybdenum that has had its surface cleaned to remove oxides prior to the formation of the palladium clusters.

5. The resolution standard of claim 4 wherein the cluster growth is characterized by a grayish appearance of the substrate.

* * * * *